(12) United States Patent
Rao

(10) Patent No.: US 9,467,132 B2
(45) Date of Patent: Oct. 11, 2016

(54) SELF-POWERED COMPARATOR

(71) Applicant: UNIVERSITY OF FLORIDA RESEARCH FOUNDATION, INC., Gainesville, FL (US)

(72) Inventor: Yuan Rao, Gainesville, FL (US)

(73) Assignee: UNIVERSITY OF FLORIDA RESEARCH FOUNDATION, INC., Gainesville, FL (US)

(*) Notice: Subject to any disclaimer, the term of this patent is extended or adjusted under 35 U.S.C. 154(b) by 0 days.

(21) Appl. No.: 13/711,298

(22) Filed: Dec. 11, 2012

(65) Prior Publication Data

US 2013/0106465 A1 May 2, 2013

Related U.S. Application Data

(62) Division of application No. 12/942,768, filed on Nov. 9, 2010, now Pat. No. 8,354,871.

(60) Provisional application No. 61/259,448, filed on Nov. 9, 2009.

(51) Int. Cl.
*H03K 5/22* (2006.01)
*H03F 3/45* (2006.01)
(Continued)

(52) U.S. Cl.
CPC ............ *H03K 5/22* (2013.01); *H03F 1/0222* (2013.01); *H03F 1/0233* (2013.01);
(Continued)

(58) Field of Classification Search
CPC ............ H03F 1/0222; H03F 1/0266; H03F 3/45183; H03F 2200/375; H03F 2203/45644; H03K 5/22
USPC ........ 327/63–65, 68; 330/252, 253, 261, 297
See application file for complete search history.

(56) References Cited

U.S. PATENT DOCUMENTS 4,598,215 A * 7/1986 Schechtman et al. .......... 327/66
4,611,130 A * 9/1986 Swanson ................ H03K 5/249
327/52

(Continued)

FOREIGN PATENT DOCUMENTS

WO WO-97/24795 A1 7/1997
WO WO-2005/064793 A1 7/2005
WO WO-2007/055265 A1 5/2007

OTHER PUBLICATIONS

Cheng, S., "Modeling of Magnetic Vibrational Energy Harvesters Using Equivalent Circuit Representations," *Journal of Micromechanics and Microengineering*, Nov. 2007, pp. 2328-2335, vol. 17, No. 11.

(Continued)

*Primary Examiner* — Patrick O'Neill
(74) *Attorney, Agent, or Firm* — Saliwanchik, Lloyd & Eisenschenk

(57) ABSTRACT

Embodiments of the invention relate to an input-powered comparator. Embodiments of the invention also pertain to an active diode that includes an input-powered comparator and a switch. In a specific embodiment, the input-powered comparator only consumes power when an input source provides sufficiently high voltage. Embodiments of the active diode can be used in an energy harvesting system. The comparator can be powered by the input and the system can be configured such that the comparator only consumes power when the input is ready to provide power to the load or energy storage element. In a specific embodiment, when there is no input, or the input is too low for harvesting, the comparator does not draw any power from the energy storage element (e.g., battery or capacitor) of the system.

20 Claims, 10 Drawing Sheets

(51) Int. Cl.
    H03F 1/02      (2006.01)
    H03K 17/30     (2006.01)
(52) U.S. Cl.
    CPC ....... *H03F 1/0266* (2013.01); *H03F 3/45183* (2013.01); *H03F 2200/375* (2013.01); *H03F 2200/411* (2013.01); *H03F 2203/45644* (2013.01); *H03K 2017/307* (2013.01)

(56) References Cited

U.S. PATENT DOCUMENTS

| | | | |
|---|---|---|---|
| 5,012,450 A * | 4/1991 | Mattausch et al. | ........... 365/208 |
| 5,099,302 A | 3/1992 | Pavlin | |
| 6,781,804 B1 | 8/2004 | Claverie | |
| 7,199,636 B2 | 4/2007 | Oswald et al. | |
| 7,331,803 B2 | 2/2008 | Steigerwald et al. | |
| 7,429,805 B2 | 9/2008 | Hamel et al. | |
| 8,354,871 B2 * | 1/2013 | Rao | ............... 327/330 |
| 2007/0141874 A1 | 6/2007 | Steigerwald et al. | |

OTHER PUBLICATIONS

Liu, Y., et al., "Active Piezoelectric Energy Harvesting: General Principle and Experimental Demonstration," *Journal of Intelligent Material Systems and Structures,* Mar. 2009, pp. 575-585, vol. 20, No. 5.

Maurath, D., et al., "Highly Efficient Integrated Rectifier and Voltage Boosting Circuits for Energy Harvesting Applications," *Advanced in Radio Science,* 2008, pp. 219-225, vol. 6.

Texas Instruments, "Energy harvesting becomes reality with AdaptivEnergy's wireless, remote sensing solution based on TI ultra-low power technology," Texas Instruments NewsCenter, Aug. 19, 2008, http://newscenter.ti.com/Blogs/newsroom/archive/2008/08/19/energy-harvesting-becomes-reality-with-adaptivenergy-s-wireless-remote-sensing-solution-based-on-ti-ultra-low-power-technology-sc08102.aspx.

Sze, N.-M., et al. "Integrated Single-Inductor Dual-Input Dual-Output Boost Converter for Energy Harvesting Applications," 2008 IEEE International Symposium on Circuits and Systems, May 18-21, 2008, Seattle, WA, pp. 2218-2221.

Vullers, R.J.M., et al., "Micropower Energy Harvesting," *Solid-State Electronics,* Jul. 2009, pp. 684-693, vol. 53, No. 7.

Office Action dated Jun. 11, 2012 in U.S. Appl. No. 12/942,768.

Notice of Allowance dated Oct. 30, 2012 in U.S. Appl. No. 12/942,768.

* cited by examiner

SELF-POWERED COMPARATOR

CROSS-REFERENCE TO RELATED APPLICATION(S)

The present application is a divisional of U.S. patent application Ser. No. 12/942,768, filed Nov. 9, 2010, which claims the benefit of U.S. Provisional patent application No. 61/259,448, filed Nov. 9, 2009, both of which are hereby incorporated by reference herein in their entirety, including any figures, tables, and drawings.

BACKGROUND OF INVENTION

Existing active diodes used in energy harvester systems often have a comparator in an active rectifier that is powered either by an external power supply or by an energy storage element used to store the harvested energy. The energy storage element can be, for example, a battery or a capacitor. For systems that power the comparator via the energy storage element, the comparator often consumes power from the energy storage element even when the system is not harvesting any energy from the input (energy harvester). By consuming power from the energy storage element when the system is not harvesting energy, the energy storage element can be unnecessarily drained and potentially not sufficiently charged when needed. In order for the comparator to draw power from the energy storage element, the energy storage element needs to have sufficient charge to power the comparator. Accordingly, for systems where the comparator is powered by the energy storage element, the interval between two consecutive charging cycles should not be long enough for the comparator to drain the energy storage element to a point that the energy storage element no longer has sufficient energy to power the comparator, in order for the system to function properly.

BRIEF SUMMARY

Embodiments of the invention relate to an input-powered comparator. Embodiments of the invention also pertain to an active diode that includes an input-powered comparator and a switch. In a specific embodiment, the input-powered comparator only consumes power when an input source provides sufficiently high voltage. Embodiments of the active diode can be used in an energy harvesting system. The comparator can be powered by the input and the system can be configured such that the comparator only consumes power when the input is ready to provide power to the load or energy storage element. In a specific embodiment, when there is no input, or the input is too low for harvesting, the comparator does not draw any power from the energy storage element (e.g., battery or capacitor) of the system.

Accordingly, the input can be used as a power supply for the comparator, which can reduce, or eliminate, the stand-by power used when the input is zero, too low in power to be harvested, or meets other criteria. Embodiments of the subject energy harvester system can eliminate the need for pre-charging, have greater efficiency, and allow for indefinitely long intervals between charging cycles.

DETAILED DISCLOSURE

Embodiments of the invention relate to an input-powered comparator. Embodiments of the invention also pertain to an active diode that includes an input-powered comparator and a switch. In a specific embodiment, the input-powered comparator only consumes power when an input source provides sufficiently high voltage. Embodiments of the active diode can be used in an energy harvesting system. The comparator can be powered by the input and the system can be configured such that the comparator only consumes power when the input is ready to provide power to the load or energy storage element. In a specific embodiment, when there is no input, or the input is too low for harvesting, the comparator does not draw any power from the energy storage element (e.g., battery or capacitor) of the system.

Accordingly, the input can be used as a power supply for the comparator, which can reduce, or eliminate, the stand-by power used when the input is zero, too low in power to be harvested, or meets other criteria. Embodiments of the subject energy harvester system can eliminate the need for pre-charging, have greater efficiency, and allow for indefinitely long intervals between charging cycles.

Figure 1:
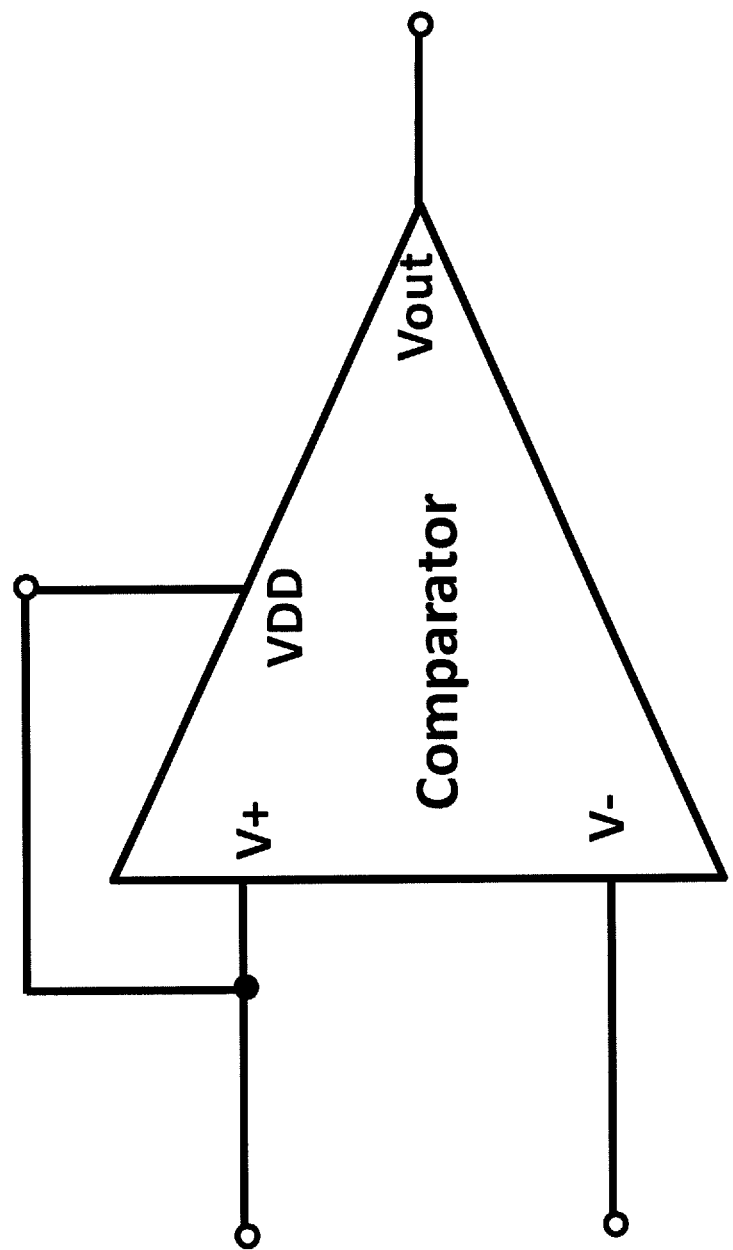
FIG. 1 shows a self-powered voltage comparator in accordance with an embodiment of the subject invention.

FIG. 1 shows a self-powered voltage comparator in accordance with an embodiment of the subject invention. The comparator has two input pins (V+, V−), one power supply pin (VDD), and one output pin (Vout). There need not be a separate power supply for the comparator as the comparator is powered, if needed, by the input. The power supply pin is connected with one of the input pins (V+) such that the comparator is supplied power via the V+ input pin. When the voltage at V+ is greater than at V−, Vout is low, e.g., a zero voltage. When the voltage of V+ is less than the voltage at V−, Vout is high. In an alternative embodiment, this pattern for Vout can be reversed such that Vout is high when V+ is greater than V− and Vout is low when V+ is less than V−. An energy harvester, or other input, can be connected to V+ such that the energy harvester can turn on the comparator and power the comparator. In a specific embodiment, the energy storage element of the energy harvester system is connected to V−, such as a capacitor of an energy storage element.

Figure 2A:
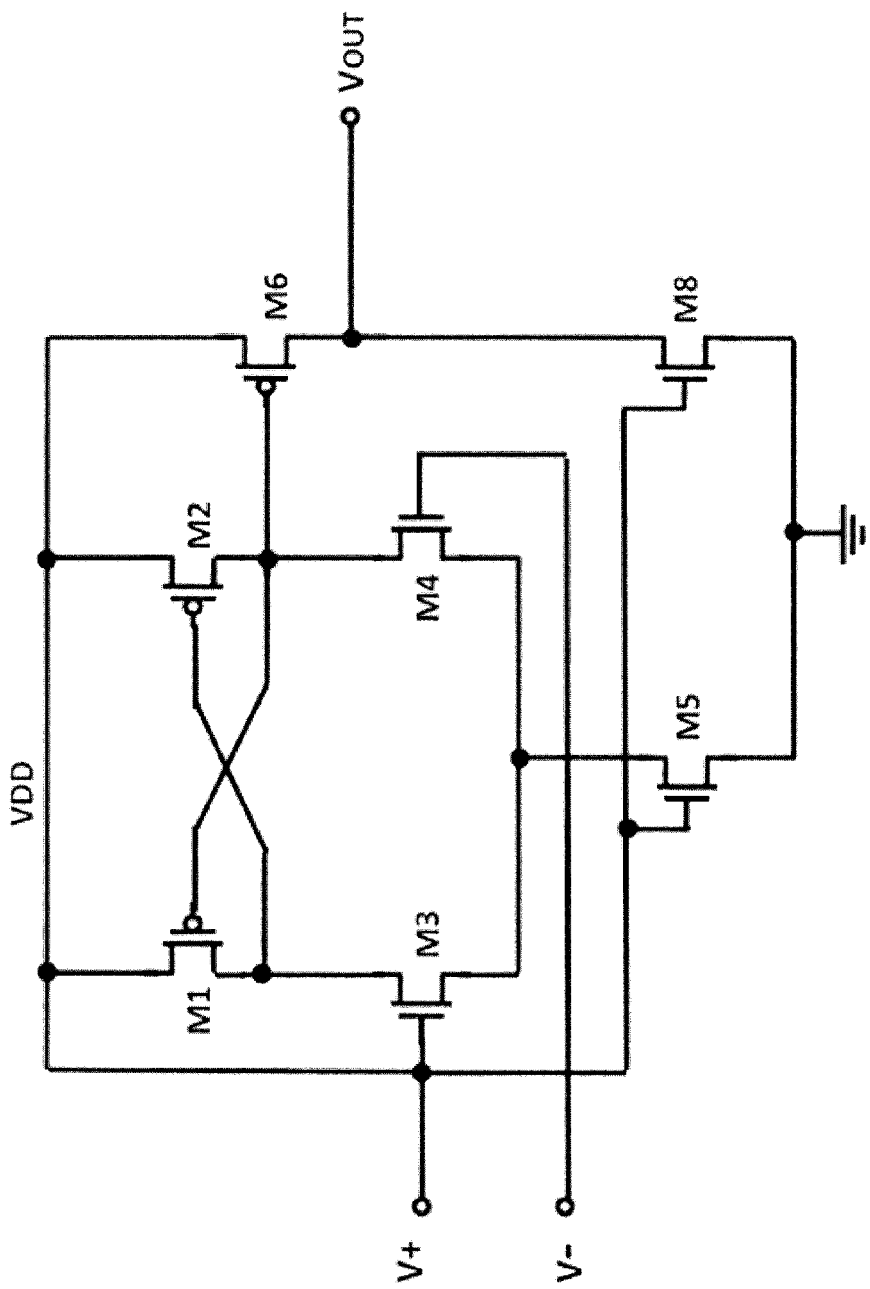
FIG. 2A shows a schematic of an embodiment of the input-powered voltage comparator of FIG. 1.
Figure 2B:
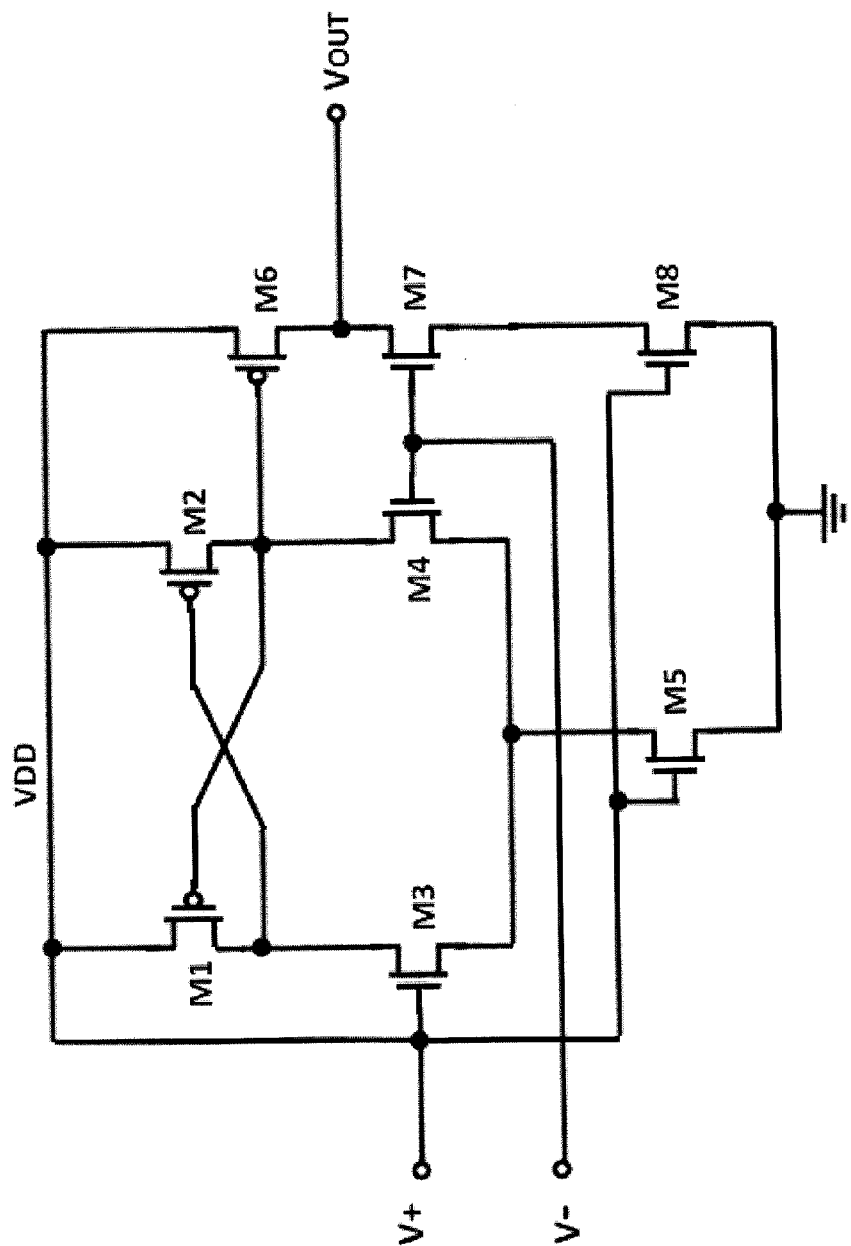
FIG. 2B shows a schematic of a specific embodiment of the input-powered voltage comparator of FIG. 1 with reduced offset.
Figure 2C:
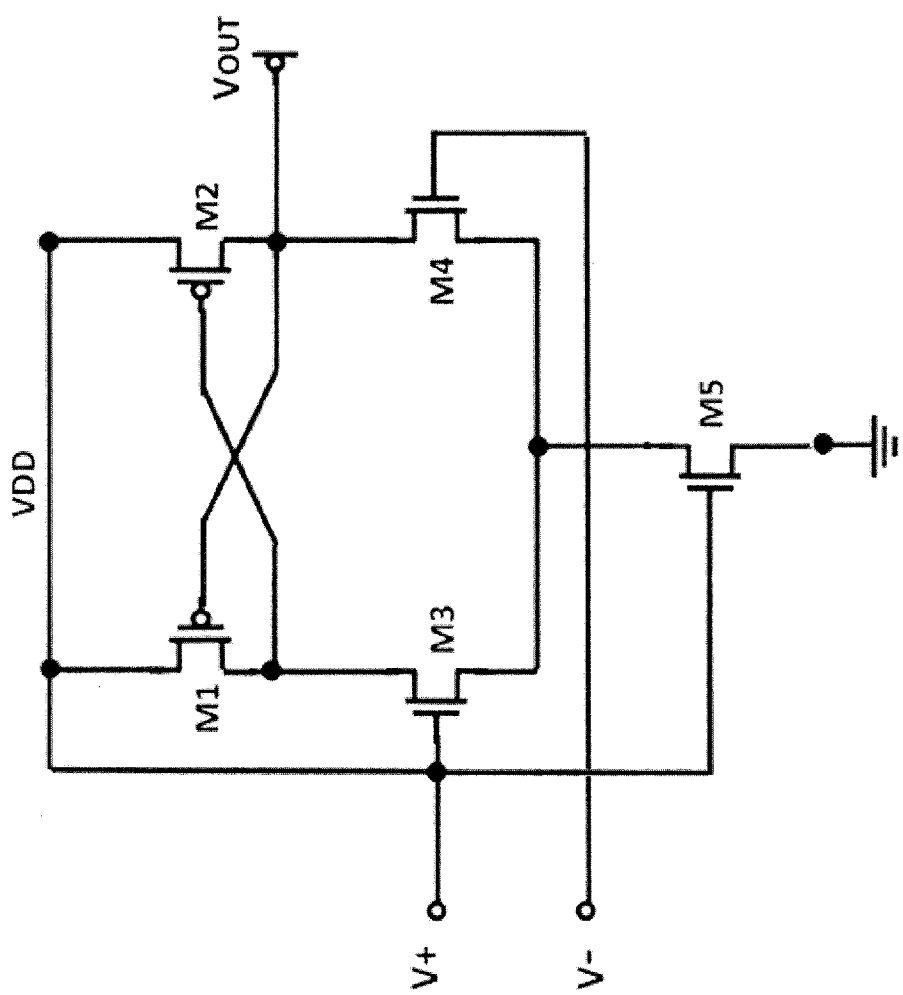
FIG. 2C shows a schematic of an embodiment of the input-powered voltage comparator of FIG. 1.

Two schematics of the comparator of FIG. 1 are shown in FIGS. 2A-2B, where both of the schematics are functional circuits verified by simulation. FIG. 2B shows a schematic of a comparator with less offset than the comparator represented by the schematic of FIG. 2A. The schematic of FIG. 2B can be considered to have two stages. The first stage includes a differential transistor pair (M3, M4) and a latch (M1, M2). The second stage (M6, M8) inverts the input to gate of M6 with M7 added to reduce the comparator offset. The first stage's power supply (VDD) connects to input (V+). The second stage's power supply (VDD) connects to the input (V+). Bias voltage (M5 gate voltage and M8 gate voltage) for both stages is provided by input (V+). When used in an energy harvester system in a specific embodiment, V− can be connected to a capacitor of the energy storage element. The voltage can be brought to VDD and M5 gate and M8 gate via separate electrical connectors connected to the input and/or V+. In a further specific embodiment, the second stage (M6, M8) and/or M7 can be removed and the input to the gate of M6 can be the output of the comparator. Such an embodiment can have an inverted Vout profile and may not have the same range of output voltages, and, therefore, may not be as desirable, as the second stage (M6, M8) also rectifies the output voltage and increases the voltage range of output voltages.

Figure 3A:
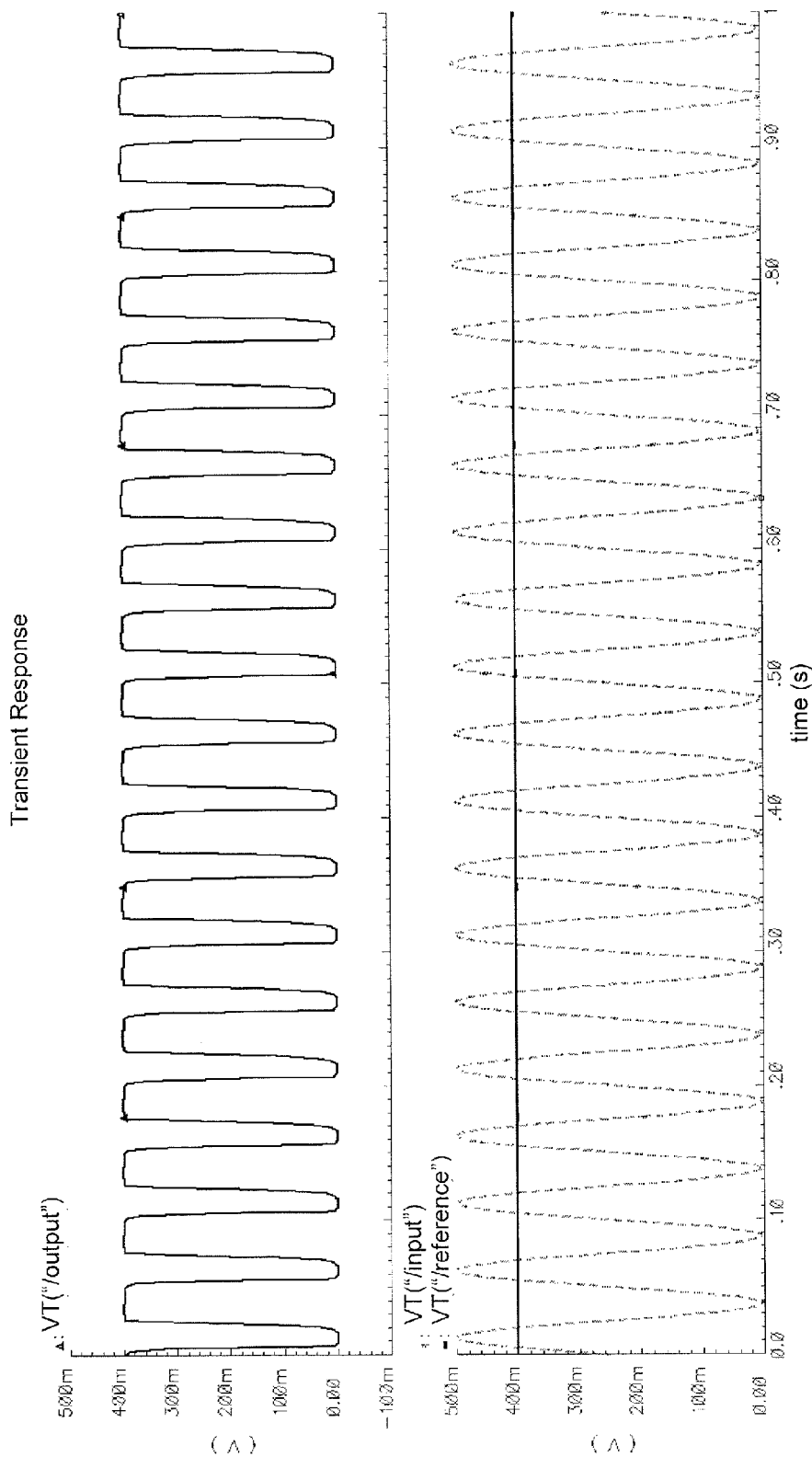
FIG. 3A shows a simulation result for the circuit shown in FIG. 2B, when V+=500 mVpp Sinewave, Vref=400 mV.
Figure 3B:
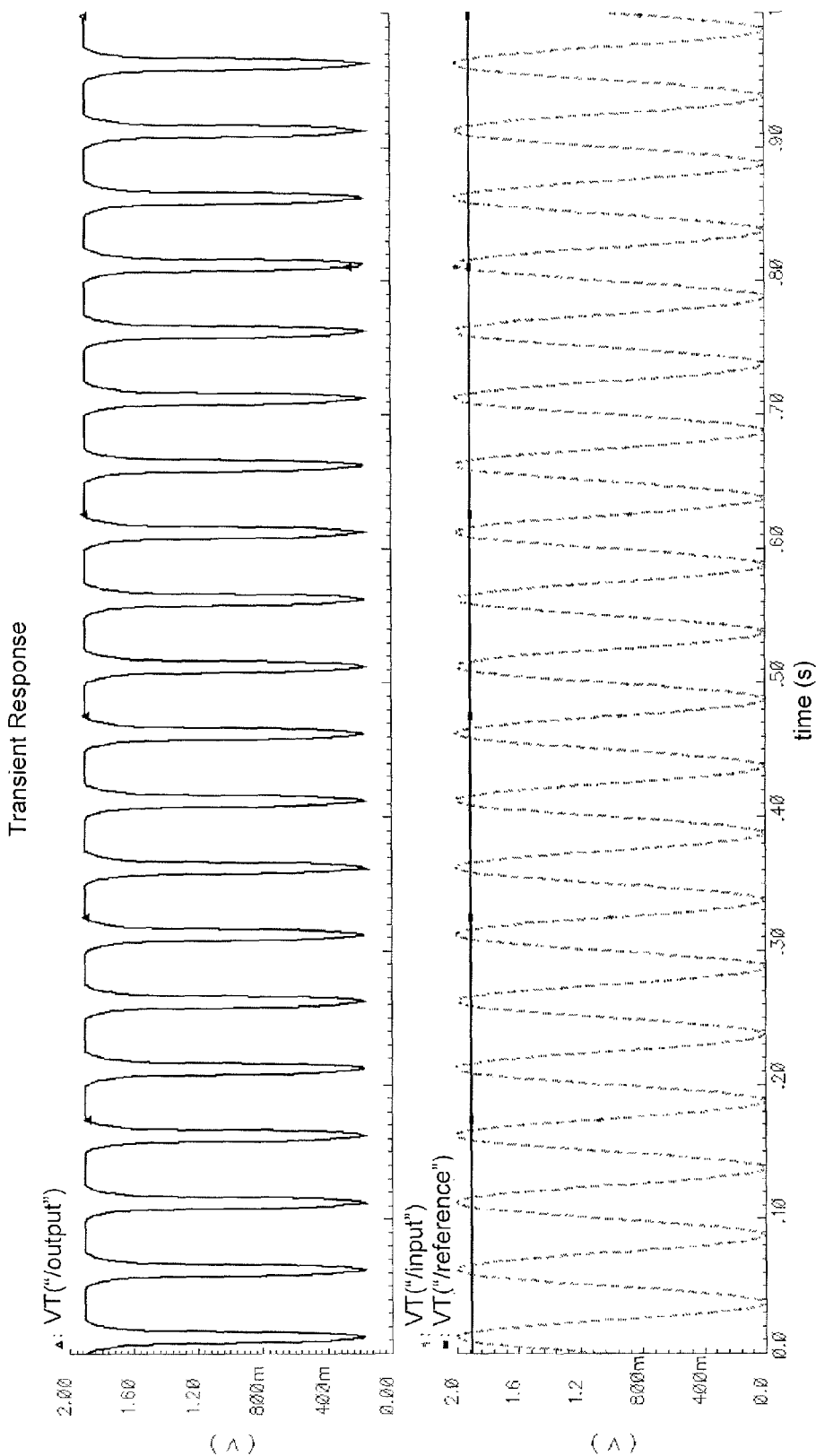
FIG. 3B shows a simulation result for the circuit shown in FIG. 2B, when V+=2 Vpp Sinewave, Vref=1.9V.

The circuit can be built on CMOS technology. In an embodiment, all of the transistors are CMOS transistors. In alternative embodiments, other types of transistors can be utilized to implement the comparator. A specific CMOS circuit was simulated with AMI 0.6um process model. The simulation indicates the circuit functions correctly with input voltage varying from 400 mV to 2.0V, as shown in FIG. 3A and FIG. 3B. The circuit uses technology scalable in other processes. For example, with scaled transistors' width and length, the circuit works in simulation with a CMOS 0.35um and 0.13um process model. The circuit is also fabricated as a chip using Onsemi 0.5um process and the chip works as the simulation result.

Figure 4A:
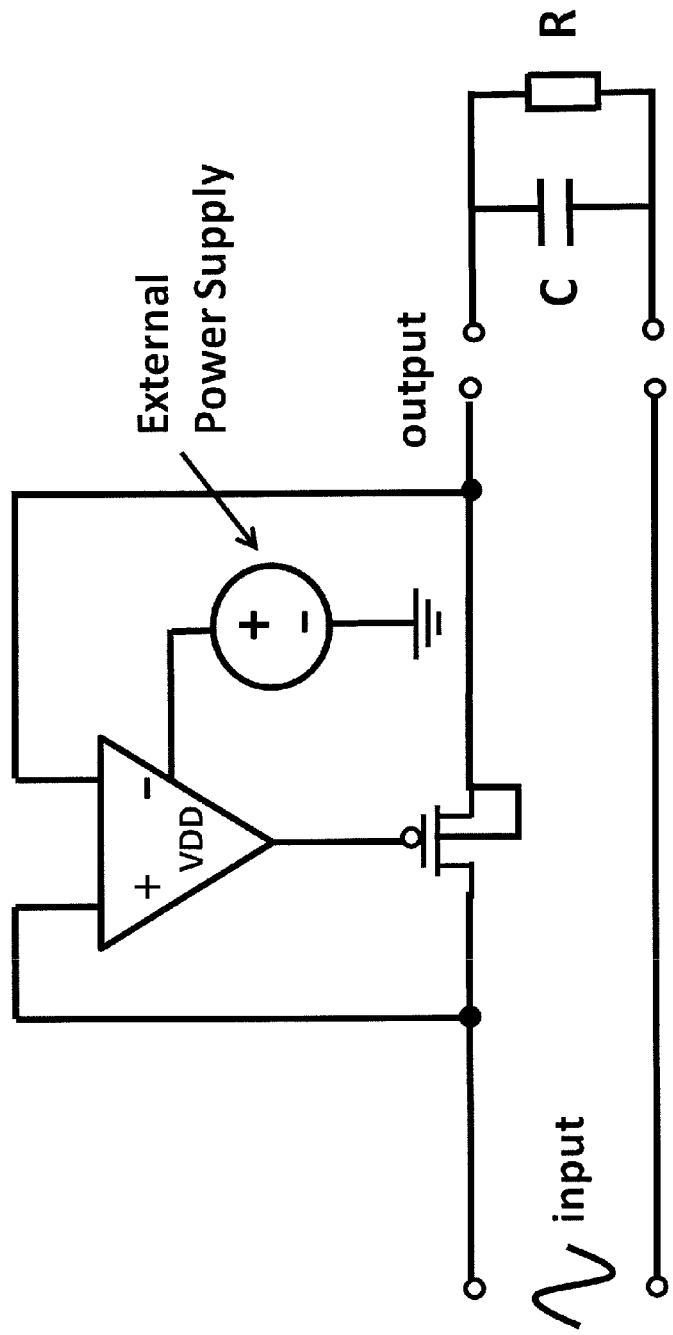
FIG. 4A shows a schematic of a commonly used external-powered active diode circuit.
Figure 4B:
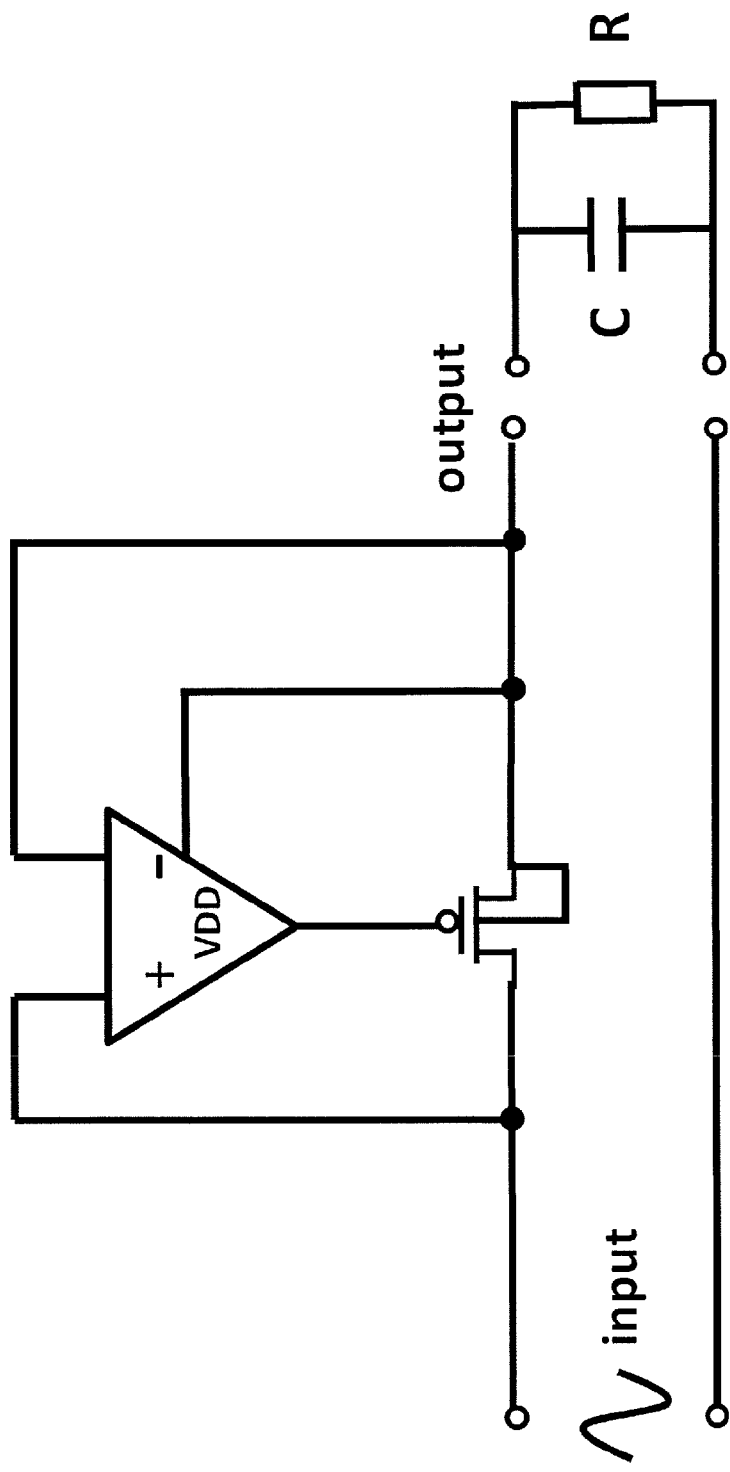
FIG. 4B shows a schematic of a specific embodiment of an output-powered active diode circuit.
Figure 5A:
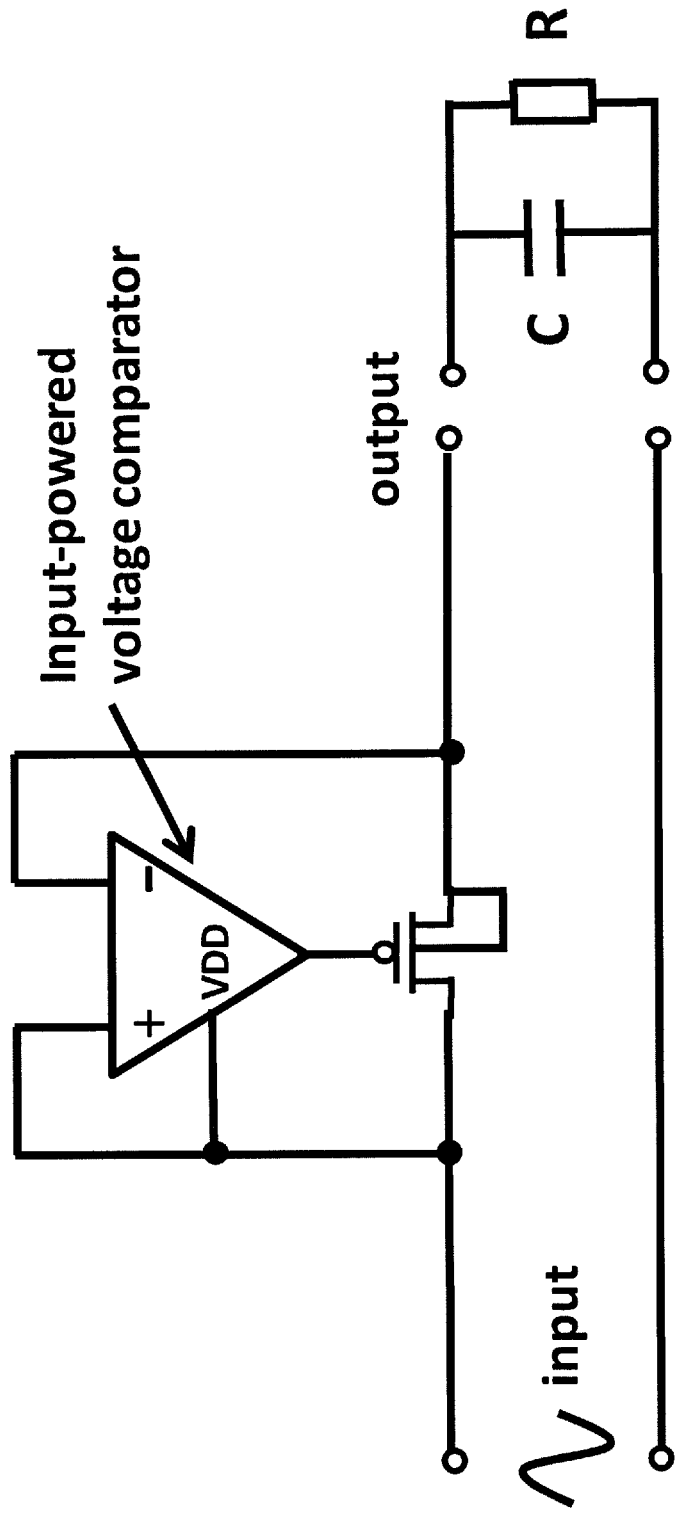
FIG. 5A shows a schematic of an input-powered active diode circuit in accordance with an embodiment of the subject invention.

FIG. 4A and FIG. 4B show commonly used active diodes. The comparators are either powered by, for example, an external power supply or an output storage capacitor. As shown in FIG. 5A, embodiments of the invention can use the input as the power supply for the comparator.

Figure 5B:
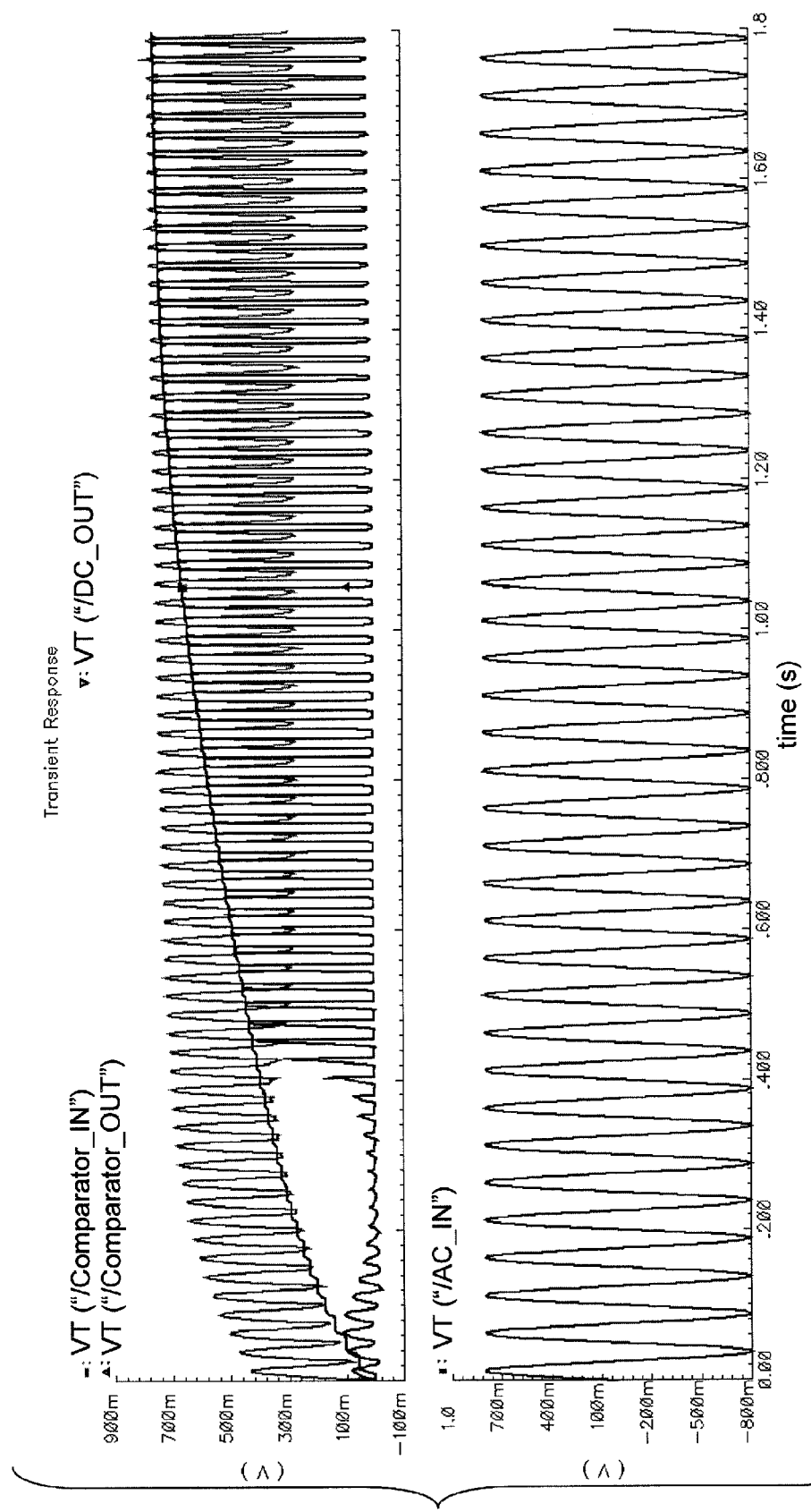
FIG. 5B shows simulation results for the circuitry of FIG. 5A.

For a specific embodiment for use with an energy harvester, the circuitry for an input-powered active diode is shown in FIG. 5A. Referring to FIG. 5A, the comparator and the CMOS transistor, taken together, can be considered an active diode. Simulation results for the circuitry of FIG. 5A are shown in FIG. 5B. Referring to FIG. 5A, the energy harvester can connect to the input at the left, which connects to the V+ pin of the comparator. The energy harvester also connects to the source of the CMOS transistor, which functions as a switch to allow power to be delivered from the energy harvester to the energy storage element. The switch can be, for example, a BJT transistor, a JFET transistor, or an analog switch. The drain of the CMOS transistor is connected to the energy storage element and to the V− pin of the comparator. The energy storage element is represented on the right of the FIG. 5A as a capacitor, C, in parallel with resistor, R. The output, Vout, of the comparator is connected to the gate of the CMOS transistor (switch) and turns the CMOS transistor on when Vout is low, allowing power to flow from the energy harvester to the energy storage element. Other transistors can be used instead of the CMOS transistor. In other embodiments, a CMOS transistor, or other transistor type, can be turned on when the voltage applied to the gate is high. In a further embodiment, a transistor that turns on with a high voltage applied to the gate can be used and an inverter can be introduced between the output of the comparator, Vout, and the gate of the transistor.

Accordingly, when the energy harvester has a voltage (V+) above the voltage of the energy storage element (V−), Vout is low, thus turning on the CMOS transistor (switch) and allowing power to flow from the energy harvester to the energy storage element. Advantageously, when the energy harvester voltage is higher than the energy storage element voltage, the comparator is powered by the energy harvester, and when the energy harvester voltage is lower than the energy storage element voltage, the comparator does not use any power. In particular, when the energy harvester voltage is higher than the energy storage element voltage, the first stage of the comparator is powered by the energy harvester.

All patents, patent applications, provisional applications, and publications referred to or cited herein are incorporated by reference in their entirety, including all figures and tables, to the extent they are not inconsistent with the explicit teachings of this specification.

It should be understood that the examples and embodiments described herein are for illustrative purposes only and that various modifications or changes in light thereof will be suggested to persons skilled in the art and are to be included within the spirit and purview of this application.

What is claimed:

1. A comparator, comprising:
a first input connector;
a second input connector;
an input power connector; and
an output connector,
wherein the comparator is configured to connect to an AC voltage source via the first input connector such that an AC voltage of the AC voltage source is applied to the first input connector,
wherein the comparator is configured to connect to a DC energy storage element via the second input connector such that a DC energy storage element DC voltage is applied to the second input connector,
wherein the comparator is configured to connect to the AC voltage source via the input power connector such that the AC voltage of the AC voltage source is applied to the input power connector, such that the comparator is powered by the AC voltage source when the AC voltage of the AC voltage source applied to the first input connector is higher than a threshold voltage,
wherein the output connector outputs a comparator output voltage,
wherein the comparator only consumes power when the AC voltage of the AC voltage source is higher than the threshold voltage,
wherein when the AC voltage is higher than the threshold voltage, either:
(i) when the AC voltage of the AC voltage source is higher than the DC energy storage element DC voltage, the comparator output voltage is low, and when the AC voltage is lower than the DC energy storage element DC voltage, the comparator output voltage is high; or
(ii) when the AC voltage of the AC voltage source is higher than the DC energy storage element DC voltage, the comparator output voltage is high, and when the AC voltage is lower than the DC energy storage element DC voltage, the comparator output voltage is low,
wherein the comparator comprises a bias current source comprising a bias current source transistor,
wherein a bias current source gate of the bias current source transistor is connected to the AC voltage source via the input power connector such that the AC voltage of the AC voltage source is applied to the bias current source gate of the bias current source transistor, and
wherein the threshold voltage is a threshold voltage of the bias current source transistor such that when the AC voltage of the AC voltage source is higher than the threshold voltage of the bias current source transistor, the bias current source is turned on.

2. The comparator according to claim 1, further comprising:
the DC energy storage element,
wherein the second input connector is connected to the DC energy storage element such that the DC energy storage element DC voltage is applied to the second input connector.

3. The comparator according to claim 2,
wherein the DC energy storage element is a storage capacitor.

4. A comparator, comprising:
a first input connector, wherein the comparator is configured to connect to a first voltage source via the first input connector such that a first voltage of the first voltage source is applied to the first input connector;
a second input connector, wherein the comparator is configured to connect to a second voltage source via the second input connector such that a second voltage of the second voltage source is applied to the second input connector;
an input power connector, wherein the comparator is configured to connect to the first voltage source via the input power connector such that a first voltage of the first voltage source is applied to the input power connector, such that the comparator is powered by the first voltage source when a first voltage of the first voltage source applied to the input power connector is higher than a threshold voltage;
an output connector, wherein the output connector outputs a comparator output voltage;
a latch comprising a first latch transistor and a second latch transistor;
a bias current source comprising a bias source transistor; and
a differential transistor pair comprising a first differential pair transistor and a second differential pair transistor;
wherein a first differential pair gate of the first differential pair transistor is connected to the first input connector such that the first voltage of the first voltage source is applied to the first differential pair gate,
wherein a second differential pair gate of the second differential pair transistor is connected to the second input connector such that the second voltage of the second voltage source is applied to the second differential pair gate,
wherein the comparator only consumes power when the first voltage of the first voltage source is higher than the threshold voltage,
wherein the comparator comprises a first stage,
wherein the first stage comprises the differential transistor pair coupled between the latch and the bias current source,
wherein when the first voltage is higher than the threshold voltage the bias current source is turned on,
wherein the first stage produces a first stage output voltage, and
wherein when the first voltage is higher than the threshold voltage, either:
  (i) when the first voltage of the first voltage source is higher than the second voltage of the second voltage source, the first stage output voltage is low, and when the first voltage of the first voltage source is lower than the second voltage of the second voltage source, the first stage output voltage is high; or
  (ii) when the first voltage of the first voltage source is higher than the second voltage of the second voltage source, the first stage output voltage is high, and when the first voltage of the first voltage source is lower than the second voltage of the second voltage source, the first stage output voltage is low,
wherein a bias current source gate of the bias current source transistor is connected to the first voltage source via the input power connector such that the first voltage of the first voltage source is applied to the bias current source gate of the bias current source transistor, and
wherein the threshold voltage is a threshold voltage of the bias source transistor such that when the first voltage of the first voltage source is higher than the threshold voltage of the bias current source transistor, the bias current source is turned on.

5. The comparator according to claim 4,
wherein the comparator comprises a second stage,
wherein the second stage receives the first stage output voltage and outputs a second stage output voltage,
wherein when the first voltage of the first voltage source is higher than the threshold voltage:
  (i) the second stage output voltage is high when the first stage output voltage is low; and
  (ii) the second stage output voltage is low when the first stage output voltage is high, and
wherein the second stage output voltage is the comparator output voltage.

6. The comparator according to claim 4,
wherein the first stage output voltage is high when the first voltage is higher than the threshold voltage and the first voltage is higher than the second voltage, and
wherein the first stage output voltage is the comparator output voltage.

7. The comparator according to claim 4,
wherein the comparator comprises a second stage,
wherein the second stage receives the first stage output voltage and outputs a second stage output voltage,
wherein when the first voltage of the first voltage source is higher than the threshold voltage:
  (i) the second stage output voltage is high when the first stage output voltage is low; and
  (ii) the second stage output voltage is low when the first stage output voltage is high,
wherein the second stage output voltage is the comparator output voltage, and
wherein the second stage output voltage is rectified with respect to the first stage output voltage.

8. The comparator according to claim 4,
wherein the first stage output voltage is the comparator output voltage.

9. The comparator according to claim 4,
wherein the comparator comprises a second stage,
wherein the second stage receives the first stage output voltage and outputs a second stage output voltage,
wherein when the first voltage of the first voltage source is higher than the threshold voltage:
  (i) the second stage output voltage is high when the first stage output voltage is low; and
  (ii) the second stage output voltage is low when the first stage output voltage is high,
wherein the second stage comprises a first second stage transistor,
wherein the first stage output voltage is applied to a first second stage gate of the first second stage transistor, and wherein the second stage output voltage is the comparator output voltage.

10. The comparator according to claim 9,
wherein the second stage comprises an additional second stage transistor,
wherein the second voltage is applied to an additional second stage gate of the additional second stage transistor, and
wherein the additional second stage transistor reduces a comparator offset of the comparator.

11. The comparator according to claim 9,
wherein the second stage comprises a second bias current source comprising a second bias current source transistor, and
wherein the first voltage of the first voltage source is applied to a second bias current source gate of the second bias source transistor such that when the first voltage of the first voltage source is higher than a second threshold voltage of the second bias current source transistor, the second bias current source is turned on.

12. The comparator according to claim 11,
wherein the second stage comprises an additional second stage transistor, and
wherein the second voltage of the second voltage source is applied to an additional second stage gate of the additional second stage transistor.

13. The comparator according to claim 4,
wherein the comparator comprises a second stage,
wherein the second stage receives the first stage output voltage and outputs a second stage output voltage,
wherein when the first voltage of the first voltage source is higher than the threshold voltage:
(i) the second stage output voltage is high when the first stage output voltage is low; and
(ii) the second stage output voltage is low when the first stage output voltage is high,
wherein the second stage output voltage is the comparator output voltage, and
wherein the second stage output voltage is low when the first voltage is higher than the threshold voltage and the first voltage is higher than the second voltage.

14. The comparator according to claim 4,
wherein the second differential pair transistor is electrically connected to the second latch transistor,
wherein the first stage output voltage is a voltage of an interconnection of the second differential pair transistor and the second latch transistor, and
wherein the first stage output voltage is the comparator output voltage.

15. A method of comparing an input AC voltage to a DC voltage, comprising:
providing a comparator, wherein the comparator comprises:
a first input connector;
a second input connector;
an input power connector; and
an output connector,
wherein the comparator is configured to connect to an AC voltage source via the first input connector such that an AC voltage of the AC voltage source is applied to the first input connector,
wherein the comparator is configured to connect to a DC energy storage element via the second input connector such that a DC energy storage element DC voltage is applied to the second input connector,
wherein the comparator is configured to connect to the AC voltage source via the input power connector such that the AC voltage of the AC voltage source is applied to the input power connector, such that the comparator is powered by the AC voltage source when the AC voltage of the AC voltage source applied to the first input connector is higher than a threshold voltage,
wherein the output connector outputs a comparator output voltage,
wherein the comparator only consumes power when the AC voltage of the AC voltage source is higher than the threshold voltage,
wherein when the AC voltage is higher than the threshold voltage, either:
(i) when the AC voltage of the AC voltage source is higher than the DC energy storage element DC voltage, the comparator output voltage is low, and when the AC voltage is lower than the DC energy storage element DC voltage, the comparator output voltage is high; or
(ii) when the AC voltage of the AC voltage source is higher than the DC energy storage element DC voltage, the comparator output voltage is high, and when the AC voltage is lower than the DC energy storage element DC voltage, the comparator output voltage is low;
connecting the AC voltage source to the first input connector;
connecting the DC energy storage element to the second input connector;
connecting the AC voltage source to the input power connector; and
outputting the comparator output voltage at the output connector,
wherein the comparator only consumes power when the AC voltage of the AC voltage source is higher than the threshold voltage, and
wherein when the AC voltage of the AC voltage source is higher than the threshold voltage, either:
(i) when the AC voltage of the AC voltage source is higher than the DC energy storage element DC voltage, the comparator output voltage is low, and when the AC voltage of the AC voltage source is lower than the DC energy storage element DC voltage, the comparator output voltage is high; or
(ii) when the AC voltage of the AC voltage source is higher than the DC energy storage element DC voltage, the comparator output voltage is high, and when the AC voltage of the AC voltage source is lower than the DC energy storage element DC voltage, the comparator output voltage is low.

16. The method according to claim 15,
wherein the comparator comprises a bias current source comprising a bias current source transistor,
wherein a bias current source gate of the bias current source transistor is connected to the AC voltage source via the input power connector such that the AC voltage of the AC voltage source is applied to the bias current source gate of the bias current source transistor, and
wherein the threshold voltage is a threshold voltage of the bias current source transistor such that when the AC voltage of the AC voltage source is higher than the threshold voltage of the bias current source transistor, the bias current source is turned on.

17. A method of comparing an input AC voltage to a DC voltage, comprising:

providing a comparator, wherein the comparator comprises:
a first input connector, wherein the comparator is configured to connect to a first voltage source via the first input connector such that a first voltage of the first voltage source is applied to the first input connector;
a second input connector, wherein the comparator is configured to connect to a second voltage source via the second input connector such that a second voltage of the second voltage source is applied to the second input connector;
an input power connector, wherein the comparator is configured to connect to the first voltage source via the input power connector such that a first voltage of the first voltage source is applied to the input power connector, such that the comparator is powered by the first voltage source when a first voltage of the first voltage source applied to the input power connector is higher than a threshold voltage;
an output connector, wherein the output connector outputs a comparator output voltage;
a latch comprising a first latch transistor and a second latch transistor;
a bias current source comprising a bias source transistor; and
a differential transistor pair comprising a first differential pair transistor and a second differential pair transistor;
wherein a first differential pair gate of the first differential pair transistor is connected to the first input connector such that the first voltage of the first voltage source is applied to the first differential pair gate,
wherein a second differential pair gate of the second differential pair transistor is connected to the second input connector such that the second voltage of the second voltage source is applied to the second differential pair gate,
wherein the comparator only consumes power when the first voltage of the first voltage source is higher than the threshold voltage,
wherein the comparator comprises a first stage,
wherein the first stage comprises the differential transistor pair coupled between the latch and the bias current source,
wherein when the first voltage is higher than the threshold voltage the bias current source is turned on,
wherein the first stage produces a first stage output voltage, and
wherein when the first voltage is higher than the threshold voltage, either:
(i) when the first voltage of the first voltage source is higher than the second voltage of the second voltage source, the first stage output voltage is low, and when the first voltage of the first voltage source is lower than the second voltage of the second voltage source, the first stage output voltage is high; or
(ii) when the first voltage of the first voltage source is higher than the second voltage of the second voltage source, the first stage output voltage is high, and when the first voltage of the first voltage source is lower than the second voltage of the second voltage source, the first stage output voltage is low;

connecting the first voltage source to the first input connector, wherein the first voltage source is an input AC voltage source, and wherein the first voltage of the first voltage source is an AC voltage;
connecting the second voltage source to the second input connector, wherein the second voltage source is a DC voltage source, and wherein the second voltage of the second voltage source is a DC voltage;
connecting the first voltage source to the input power connector; and
outputting the comparator output voltage at the output connector,
wherein the comparator only consumes power when the first voltage of the first voltage source is higher than the threshold voltage,
wherein when the first voltage is higher than the threshold voltage, either:
(i) when the first voltage of the first voltage source is higher than the second voltage of the second voltage source, the comparator output voltage is low, and when the first voltage is lower than the second voltage of the second voltage source, the comparator output voltage is high; or
(ii) when the first voltage of the first voltage source is higher than the second voltage of the second voltage source, the comparator output voltage is high, and when the first voltage is lower than the second voltage of the second voltage source, the comparator output voltage is low.

18. The method according to claim 17,
wherein the comparator comprises a bias current source comprising a bias current source transistor,
wherein a bias current source gate of the bias current source transistor is connected to the first voltage source via the input power connector such that the first voltage of the first voltage source is applied to the bias current source gate of the bias current source transistor, and
wherein the threshold voltage is a threshold voltage of the bias current source transistor such that when the first voltage of the first voltage source is higher than the threshold voltage of the bias current source transistor, the bias current source is turned on.

19. The method according to claim 17,
wherein the comparator comprises a second stage,
wherein the second stage receives the first stage output voltage and outputs a second stage output voltage,
wherein when the first voltage of the first voltage source is higher than the threshold voltage:
(i) the second stage output voltage is high when the first stage output voltage is low; and
(ii) the second stage output voltage is low when the first stage output voltage is high,
wherein the second stage comprises a first second stage transistor,
wherein the first stage output voltage is applied to a first second stage gate of the first second stage transistor, and
wherein the second stage output voltage is the comparator output voltage.

20. The method according to claim 19,
wherein the second stage comprises an additional second stage transistor,
wherein the second voltage is applied to an additional second stage gate of the additional second stage transistor, and wherein the additional second stage transistor reduces a comparator offset of the comparator.

* * * * *